United States Patent [19]

Chao et al.

[11] Patent Number: 4,673,960
[45] Date of Patent: Jun. 16, 1987

[54] FABRICATION OF METAL LINES FOR SEMICONDUCTOR DEVICES

[75] Inventors: Pane-Chane Chao, Liverpool; Walter H. Ku, Ithaca, both of N.Y.

[73] Assignee: Cornell Research Foundation, Inc., Ithaca, N.Y.

[21] Appl. No.: 760,786

[22] Filed: Jul. 31, 1985

Related U.S. Application Data

[60] Division of Ser. No. 550,284, Nov. 9, 1983, Pat. No. 4,551,905, which is a continuation-in-part of Ser. No. 448,158, Dec. 9, 1982, abandoned.

[51] Int. Cl.⁴ ..................... H01L 29/48; H01L 23/50; H01L 29/44; H01L 29/80
[52] U.S. Cl. ...................................... 357/22; 357/15; 357/68; 357/71
[58] Field of Search ........................ 357/22, 15, 68, 71

[56] References Cited

U.S. PATENT DOCUMENTS 4,271,424  6/1981  Inayoshi .............................. 29/571
4,337,115  6/1982  Ikeda et al. .......................... 29/591
4,377,899  3/1983  Otani et al. .......................... 29/571
4,481,706 11/1984  Roche .................................. 29/591
4,532,532  7/1985  Jackson ............................... 357/22

Primary Examiner—William D. Larkins
Assistant Examiner—R. P. Limanek
Attorney, Agent, or Firm—Jones, Tullar & Cooper

[57] ABSTRACT

A method of fabricating MESFET devices having a submicron line gate electrode is disclosed. The method includes the formation of a single layer of resist material on a semiconductor surface; formation of a resist cavity through optical lithography, the cavity exposing a selected portion of the semiconductor surface; depositing by way of angled evaporation at least one gate wall within said resist cavity, the gate wall defining a shaped gate cavity; depositing gate electrode material within the gate cavity, and removing the resist material. In one embodiment of the invention the gate wall is removed from the gate electrode material, leaving a free-standing electrode. In another embodiment, the gate wall is a permanent part of the electrode structure.

6 Claims, 8 Drawing Figures

FABRICATION OF METAL LINES FOR SEMICONDUCTOR DEVICES

BACKGROUND OF THE INVENTION

The invention described herein was made in part in the course of work under a grant award No. N00014-79-C-0767 of the Office of Naval Research.

This application is a division of application Ser. No. 550,284, filed Nov. 9, 1983, now U.S. Pat. No. 4,551,905, which is a continuation-in-part of U.S. Ser. No. 448,158, filed Dec. 9, 1982, now abandoned.

The present invention relates, in general, to high frequency semiconductor devices, and more particularly to an improved method of fabricating low-resistance submicron metal lines capable of serving as gates for metal-semiconductor field effect transistors (MESFET's). This invention further relates to the invention disclosed in the aforesaid Ser. No. 448,158, and in its divisional application Ser. No. 658,066, filed Oct. 5, 1984, now U.S. Pat. 4,536,942, issued Aug. 27, 1985, of the herein-named inventors, the disclosure of which is incorporated herein by reference.

The fabrication of a MESFET device involves the formation of drain, source and gate electrodes on the surface of a semiconductor substrate. Ohmic contacts are generally used for the drain and source electrodes, whereas a rectifying Schottky barrier metal system is used for the gate electrode. Such devices are useful in high frequency applications, particularly in the microwave range, but care must be exercised to insure that the time constant determined by the gate capacitance and resistance is sufficiently small to permit operation in the microwave range.

The parasitic gate capacitance can be minimized by shortening the gate length, but such shortening is, at best, a mixed blessing, for it can lead to a decreased cross-sectional gate area and a resultant increase in gate resistance. This, in turn, reduces the efficiency of the device and reduces gain.

A solution to the foregoing problem has been shown to be the provision of a T-shaped (or mushroom-shaped) metal line gate structure in which extremely low gate resistance and a very short gate length near the Schottky interface can be simultaneously obtained. Such T-shaped structures have been developed, in the prior art, by using a double-layer photoresist or electron beam resist technique. These techniques involve complicated optical or electron beam lithography processes, however, which present alignment and other problems. Examples of such double-layer techniques to produce T-shaped gate structures include the following:

G. O. Ladd, Jr. et al., "E-beam technology for K-band GaAs FET's," U.S. Army Report DELET-TR-77-2696-2, Hughes Aircraft Co., February 1980.

M. Omori et al., "Low resistance, fine line semiconductor device and the method for its manufacture," U.S. Pat. No. 4,213,840, issued July 22, 1980.

Y. Todokoro, "Double-layer resist films for submicrometer electron-beam lithography," IEEE Trans. Electron Devices, vol. ED-27, pp. 1443–1448, August 1980.

M. Matsumura et al., "Sub-micrometer lift-off line with T-shaped cross-sectional form," Electron. Lett., vol. 17, pp. 429–430, June 1981.

K. Kamei et al., "Extremely low-noise MESFET's fabricated by metal-organic chemical vapour deposition," Electron. Lett., vol. 17, pp. 450–451, June 1981.

G. C. Taylor et al., "Ion-implanted K-band GaAs power FET," in MTT-S Int. Microwave Symp. Dig., pp. 46–48, 1981.

T-shaped gate structures have also been fabricated by utilizing a selective dry etching of a double-layered metal, as described in the following:

H. Morkoc et al., "Tungsten/gold gate GaAs microwave FET", Electron. Lett., vol. 14, pp. 514–515, August 1978.

S. Takahashi et al., "Sub-micrometer gate fabrication of GaAs MESFET by plasma etching" IEEE Trans. Electron Devices, vol. ED-25, pp. 1213–1218, October 1978.

This technique, however, requires a calibrated undercut etching process for reliable reproducibility. Further, the dry etching process may result in damage to the device channel region. In addition, unless a self-aligned process using an $n^+$ implantation is adopted, the source resistance will be high in the resulting device, since a recessed-gate structure cannot be made using this technique.

SUMMARY OF THE INVENTION

It is therefore, an object of the present invention to provide an improved fabrication technique for the production of low-resistance metal lines for semiconductor devices.

It is another object of the invention to provide a simplified method of producing low-resistance submicron gates for metal-semiconductor field effect transistors.

Another object of the invention is to provide an improved submicron gate configuration fabricated in accordance with a simplified technique for producing improved MESFET devices.

Still another object of the present invention is to provide an improved method of fabricating T-shaped gate structures for MESFET devices which avoids the problems of prior art techniques.

It is another object of the invention to provide a new technique for generating sub-quarter-micron T-shaped and Γ-shaped gate structures for MESFET devices.

It is still another object of the present invention to provide a simplified method for fabricating low resistance T-shaped and Γ-shaped gate structures utilizing a single-level resist and an angle evaporation process.

Another object of the present invention is the fabrication of a metal line gate structure on an angle-metallized resist profile.

Still another object of the present invention is the provision of an inverted-L-shaped electrode mounted by means of an offset leg portion to produce a MESFET device having a reduced parasitic resistance.

The objects of the present invention are achieved, and the disadvantages of prior techniques are avoided, through unique fabrication processes for producing fine metal lines for semiconductors, and more particularly for producing a novel gate electrode for MESFET devices capable of operating at microwave frequencies. These processes include, in one embodiment, the steps of depositing a layer of resist material on a semiconductor surface, lithographically defining a gate pattern on the resist material, and removing the pattern area to produce a resist profile, or cavity. This resist cavity, which is elongated, has a cross-sectional profile which is slightly undercut near the upper surface of the resist, and exposes a predetermined portion of the semiconductor surface. At least one gate support is formed on at least one of the elongated inner surfaces of the resist cavity by angled evaporation to produce a gate cavity.

In one embodiment of the invention, two gate support walls are formed, one on each of the side walls of the resist cavity, by dual-angle evaporation to produce a T-shaped gate cavity. In another embodiment of the invention, angled evaporation is used to form a single gate support wall on only one side of the resist cavity to produce an inverted L-shaped (or Γ-shaped) gate cavity. In the double-wall embodiment the gate cavity has a length at the surface of the semiconductor on the order of 0.2 μm, the length being determined by the thickness of the resist layer, the length of the opening at the top of the resist layer, and the evaporation angles. In the single-wall embodiment, the top length of the cavity is slightly larger, although the resulting gate-semiconductor interface is about the same length.

After forming the gate support wall or walls, a gate material is evaporated into the gate cavity, the evaporation being in a direction normal to the semiconductor material surface to form a metal line having a downwardly extending leg contacting the semiconductor surface. The evaporation of the gate material is followed by the removal of excess gate material from the surface of the resist layer and removal of the resist layer itself, leaving the metal line supported by the gate support walls. The gate support wall or walls may be left in place to provide mechanical support for the metal line, or may be removed, as by etching, to leave a free-standing metal line. In either case, the metal line serves as a MESFET gate electrode in the preferred embodiments of the invention, and for convenience will hereinafter be referred to as such, although it should be understood that the term gate electrode includes similarly formed submicron metal lines which may be used for other purposes.

The gate electrode produced in accordance with the foregoing method has, in its cross-sectional dimension, a length at the semiconductor surface (i.e., at the Schottky interface) which may be about 0.2 μm. The electrode may have a height of about 1.6 μm and at the top of the T-shaped embodiment, a length of about 0.8 μm. In an experimental fabrication of the gate, the electrode was formed as a metal line having a T-shaped cross section, the line having a width of 150 μm. The resulting device showed a measured gate resistance of 6.1 Ω/mm of gate width, which is lower than the resistance value reported for prior devices of this type.

The processes described above are extremely simple, particularly since only a single-level resist coating is required, and no calibrated dry-etching is needed. The length of the metal gate electrode is easily established by the thickness of the resist and the length of its surface opening in conjunction with the evaporation angle or angles for producing the gate cavity. This allows the length to be controlled by a single hard-copy photomask and permits accurate control of gate length by means of calibrated, adjustable evaporation angles. Further, since the T-shaped and Γ-shaped metal lines are supported and protected by gate support walls during the fabrication process, the yield is very high for this process, even for gate lengths as short as 0.2 μm.

The gate support may be formed from a suitable metal or metal oxide such as aluminum, silicon, oxide, or the like, the selection of material depending, in part, on whether the support walls are to remain in place in the completed MESFET device. If the support walls are to remain in place to provide mechanical support for the gate electrode, an electrically insulating material such as SiO is preferred, whereas an electrically conductive material such as Al can be used if the walls are to be removed.

Since the T-shaped gate electrode is formed by the use of two gate support walls, one on each side of the resist cavity, this electrode is generally symmetrical, and, therefore, does not require the mechanical support which the Γ-shaped electrode needs. Accordingly, the process for making a T-shaped gate includes forming the two gate support walls by depositing a suitable material, which may be an electrically conductive metal such as Al, at opposed angles to coat the opposite surfaces of the resist cavity. After the gate material is deposited and the resist layer removed, leaving the electrode supported by the support walls, the two support walls may also be removed, as by etching, leaving the T-shaped electrode free standing.

Alternatively, the two gate support walls may be formed by depositing a nonconductive material such as SiO at opposed angles to coat the opposite sides of the resist cavity. After the gate material is deposited and the resist layer is removed, the T-shaped electrode remains supported by the insulating walls. These walls may be removed, or may be left in place, as desired.

The Γ-shaped gate electrode is formed through the use of a single gate wall formed on one side of the resist cavity by a single angled deposition of material. Since the Γ-shaped gate is not symmetrical, the provision of a mechanical support is preferred, in order to improve the reliability of the MESFET device. Accordingly, the process for making this gate includes the deposition of a non-conductive material such as SiO to form the gate cavity. After the gate material is deposited, the resist layer is removed, leaving the Γ-shaped electrode supported by a non-electrically conductive wall. This wall may be left in place as a permanent support for the gate electrode, providing a high geometric stability for the electrode, and high reliability.

The angle of deposition of the gate support wall material for the Γ-shaped gate is so selected that the support wall layer extends about halfway along the length of the semiconductor surface exposed by the formation of the resist cavity. Accordingly, when the gate material is deposited into the gate cavity, the accumulation of gate material will be offset toward the resist cavity surface that remained uncoated. This results in the line of contact between the gate material and the semiconductor (the Schottky interface) being closer to one side of the resist cavity than the other. This offset is selected to be toward the source electrode when the Γ-shaped metal line of the present invention is used as a gate electrode in a MESFET device, and serves to reduce parasitic resistance in the device as compared to the T-shaped electrode.

Thus, the method of the invention permits the reliable manufacture of very low resistance gate electrodes and provides a capability of fabricating sub-quarter-micron lines using only conventional optical lithography. The lines produced by this method are compatible with deeply-recessed gate structures to minimize parasitic resistances. The single-angled deposition method for Γ-shaped gates provides improved control of gate length over the double-angled approach, and simplifies the fabrication process, while retaining the low resistance and short length properties of T-shaped gates.

BRIEF DESCRIPTION OF THE DRAWINGS

The foregoing and additional objects, features and advantages of the present invention will be evident to those of skill in the art from a consideration of the following more detailed description of the invention, taken in conjunction with the accompanying drawings, in which.

DESCRIPTION OF PREFERRED EMBODIMENTS

Figure 1:
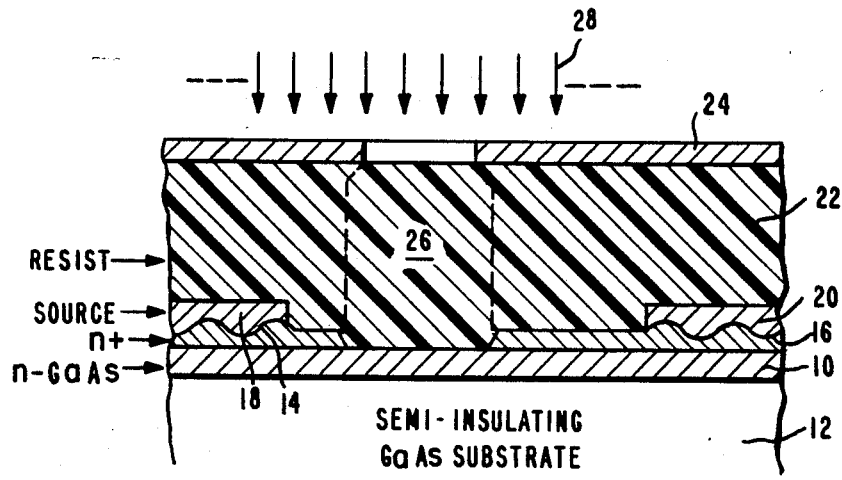
FIG. 1 is a diagrammatic cross-sectional illustration of the formation of a resist profile for a gate electrode on a MESFET device.

Turning now to a more detailed consideration of the present invention, there is illustrated in FIG. 1 a cross-sectional view of a semiconductor wafer 10 on a GaAs semi-insulating substrate 12, wherein the wafer is a material such as n-type gallium arsenide (GaAs) which is prepared for reception of a gate electrode. The wafer may be prepared in conventional manner, which may include procedures such as, for example, the epitaxial growth of layers such as ohmic electrodes 14 and 16 and the formation of source and drain contacts 18 and 20, respectively, which cooperate with the ohmic contacts to define source and drain regions in the semiconductor. The provision of source and drain electrodes prior to the formation of the gate electrode, although optional, is preferred.

After preparation of the wafer 10, a layer 22 of conventional photoresist material is deposited on the upper surface of the wafer, and on any layers and contacts formed on the wafer. By standard photolithographic techniques utilizing a conventional mask 24, a gate pattern 26 in the photoresist material is selectively exposed as by ultra-violet light 28, and then removed, as by soaking the wafer in a suitable solvent such as chlorobenzene. The result of this optical lithography is the formation of a resist profile, or cavity, 30, illustrated in FIG. 2.

Although the resist material preferably is a photoresist material, it will be apparent that other resist materials such as an electron-beam resist, can be used, and that other lithographic techniques, such as electron-beam lithography, can be used in accordance with the present invention.

Figure 2:
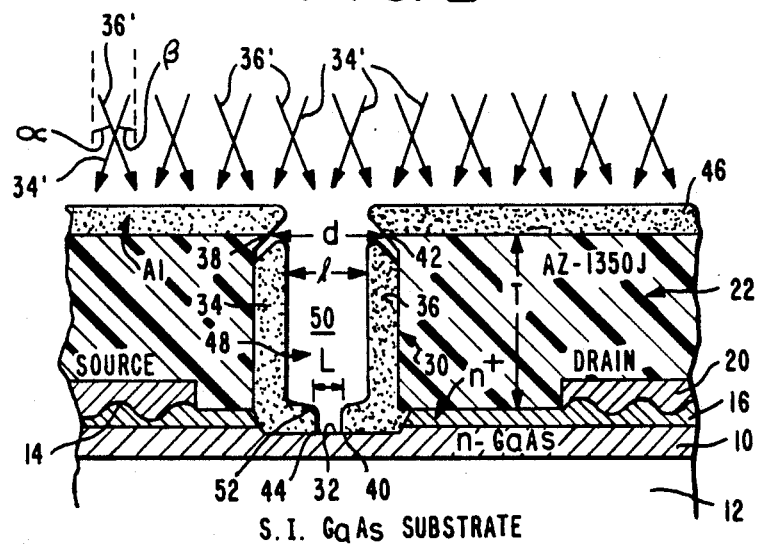
FIG. 2 is a diagrammatic cross-sectional illustration of the formation of a T-shaped gate cavity by dual-angle deposition.

The resist profile 30 is preferably an elongated cavity formed in the resist material 22 to expose a linear portion of the upper surface 32 of the n-type GaAs wafer 10 in the area between the source and drain regions, to permit fabrication of the gate electrode and the consequent formation of a Schottky interface at surface 32. The distance across the cavity, as viewed in FIG. 2, is greater than the desired length of the gate electrode in order to accommodate gate support walls, to be described. It should be understood that this distance across the cavity is, in accordance with standard terminology, the length of the cavity, since the length of a gate electrode is measured in the direction of an imaginary line running from the source electrode to the drain electrode. The gate width, therefore, is measured along the surface 32 in a direction perpendicular to the source-to-drain line.

The process for fabricating a T-shaped electrode in the elongated cavity 30 is illustrated in FIGS. 2–5, to which reference is now made. After removal of the resist material from the gate pattern 26, the exposed surface 32 may be etched in conventional manner to prepare the surface to receive the materials which are to be deposited. Thereafter, gate support walls 34 and 36 are deposited by dual angle evaporation of a suitable material which may be electrically conductive if the support walls are to be removed from the gate electrode, and which must be electrically insulating if the support walls are to remain as a part of the final structure. If the support walls are conductive, they preferably are formed of aluminum, although other metals may be suitable.

The dual angle evaporation directs an evaporant indicated by arrows 36′ at a first angle $\alpha$ from the vertical to form wall 36 and at a second angle $\beta$ from the vertical as indicated by arrows 34′ to form wall 34. The exact location and extent of the gate walls are dependent upon the thickness T of the resist material, the distance d across the surface opening of the resist profile 30, and the angles $\alpha$ and $\beta$ at which the evaporant is directed. As illustrated, the evaporant 36′ directed at angle $\alpha$ which passes the left-hand (as viewed in FIG. 2) edge 38 of the resist cavity strikes a point 40 on the right-hand portion of surface 32, so that the $\alpha$-directed evaporant deposits material from the point 40 across the surface 32 toward the right-hand wall of the resist cavity 30, and up the right-hand wall, to form gate wall 36. Similarly, the evaporant 34′ directed at angle $\beta$ which passes the right-hand edge 42 of the resist cavity strikes a point 44 on the left-hand portion of surface 32, so that $\beta$-directed evaporant deposits material from point 44 across the surface 32 toward the left-hand wall of the resist cavity 30, and up the left-hand wall, to form gate wall 34.

The gate material, which is illustrated in FIG. 2 as being Al, is deposited on the interior surfaces of the resist profile to a desired thickness, as determined by the desired maximum length l of the upper portion of the T-shaped gate. The Al is also deposited on the upper surface of the remaining resist material 22, to form a layer 46, but this is incidental to the formation of the gate walls.

The angle at which the Al evaporation is directed, the width d of the resist cavity, and the thickness T of the resist 22 cooperate to deposit walls 34 and 36 in such a way as to form a generally T-shaped gate cavity 48 having a large upper portion 50 and a narrow lower portion 52. The lower portion 52, which extends between points 40 and 44, has a length L and defines the lower portion, or leg, of the T-shaped gate electrode at its interface with surface 32, while the upper portion 50 defines the limits of the upper part of the gate electrode. By precise adjustment of the directions $\alpha$ and $\beta$ of the dual-angle evaporation, and by careful monitoring of the deposited Al, the length L of the portion 52 can be made as short as about 0.2 $\mu$m at the interface with surface 32.

The deposition of material to form the gate walls is preferably accomplished by conventional evaporation techniques, with the evaporant being directed at the angles $\alpha$ and $\beta$ in accordance with known methods.

Figure 3:
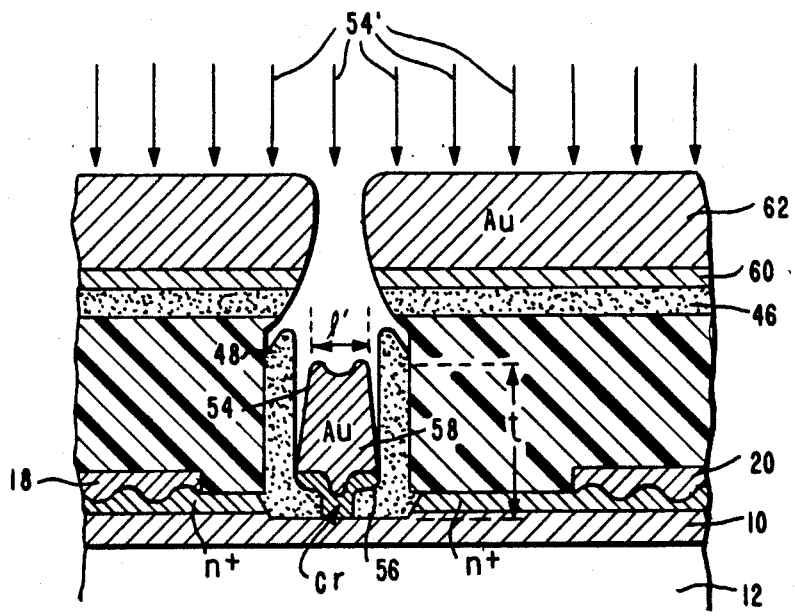
FIG. 3 is a diagrammatic cross-sectional illustration of a T-shaped gate formed within the gate cavity by direct deposition.

Upon completion of the gate cavity 48, a selected gate metal or selected gate metals are deposited in the T-shaped gate cavity 48 to form a gate electrode 54. As illustrated in FIG. 3, gate metals, for example chromium (Cr) and gold (Au), are sequentially deposited, preferably by direct vertical evaporation, as indicated by arrows 54', to form a bottom Cr layer 56 in contact with surface 32 and a top Au layer 58 overlying the layer 56. The bottom layer 56 forms the base of gate electrode 54, and, as is known in the art, is formed as a very thin layer which serves to metalize the surface 32 of wafer 10 to prepare it for receiving the top electrode layer 58. This layer 56 cooperates with the n-type material of the wafer 10 to produce a Schottky interface.

The bottom layer 56 fills the narrow lower portion 52 of the gate cavity 48, as illustrated, while the top layer 58 substantially fills the upper portion 50 of cavity 48. It will be noted that as the electrode metals are deposited in the gate cavity 48, excess metal is also deposited on the layer 46 which was previously formed on the upper surface of the resist 22, the excess Cr forming layer 60 and the excess Au forming layer 62. As illustrated in FIG. 3, the deposition of the several layers onto the upper surface of the resist 22 causes a gradual buildup which extends over the resist and gate cavities and narrows the opening through which the materials are deposited. As a result, the gate electrode is tapered slightly inwardly from bottom to top, and the deposited gate material does not completely fill the gate cavity 48.

Figure 4:
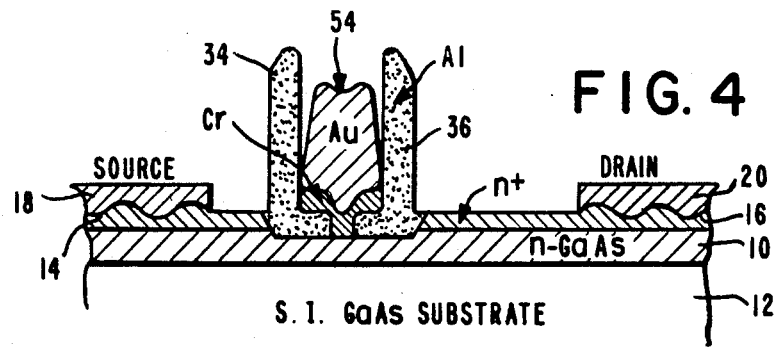
FIG. 4 is a diagrammatic cross-sectional illustration of a T-shaped gate electrode guarded by two gate walls, formed by the removal of resist material from the MESFET device.
Figure 5:
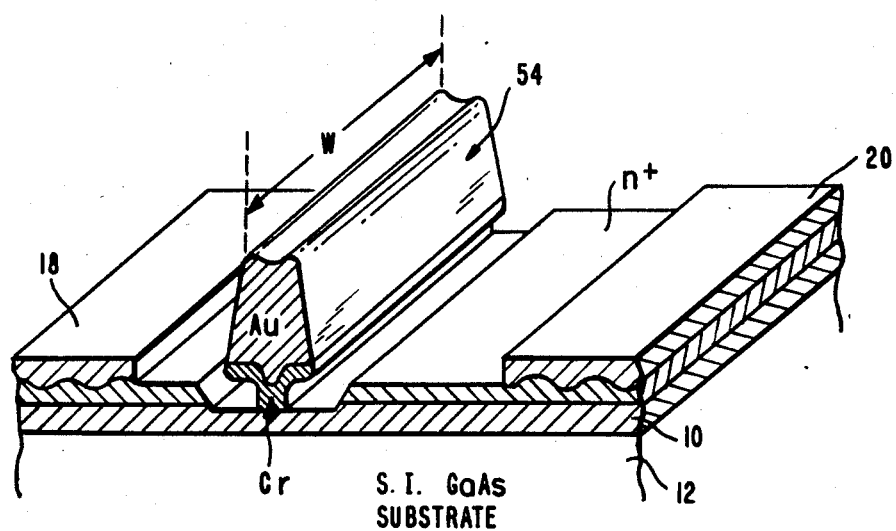
FIG. 5 is a diagrammatic perspective view in partial section of a completed T-shaped MESFET gate electrode.

After the gold layer 58 has been deposited, the excess layers 46, 60 and 62 and the resist layer 22 are removed by a suitable solvent, such as acetone, to produce a T-shaped gate electrode 54 guarded by support walls 34 and 36, as shown in FIG. 4. The walls protect the electrode during the mechanical handling that is required to effect removal of the resist and excess metal layers, and thus substantially improve the reliability and effectiveness of this fabrication process.

If the gate support walls are electrically conductive, and must be removed from the T-shaped electrode, the wafer with the gate electrode in place is finally dipped into a suitable solvent or etchant. If the gate support walls are Al, then an etchant such as hot phosphoric acid solution is used to remove them, leaving the gate electrode 54 free standing on the wafer 10 in the manner illustrated in FIG. 5.

The foregoing single-level resist and two step evaporation process provides a simple, high-yield, reliable method of fabricating T-shaped gate electrodes for semiconductor devices. A simple optical lithographic process is utilized which in experiments has given a 90% yield of very low resistance sub-half-micron T-shaped (or mushroom-shaped) gate electrodes, the process being compatible with deep-recess gate structures to minimize source resistance.

Figure 6:
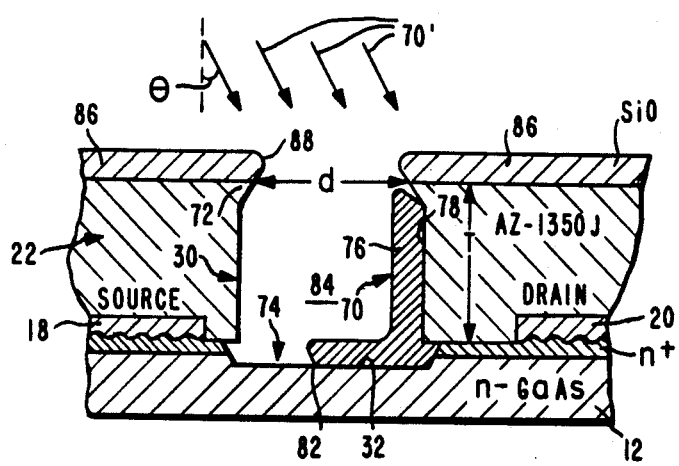
FIG. 6 is a diagrammatic cross-sectional illustration of the formation of an Γ-shaped gate cavity by single angle deposition.
Figure 7:
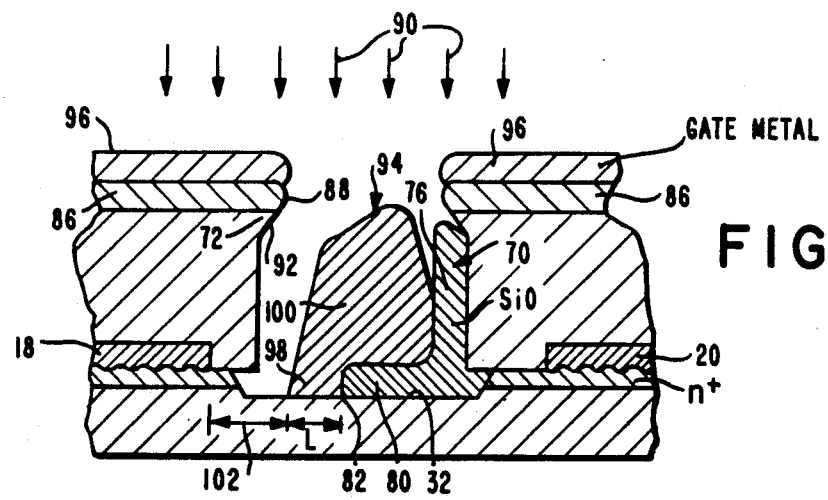
FIG. 7 is a diagrammatic cross-sectional cross-sectional illustration of an Γ-shaped gate formed within the gate cavity of FIG. 6.
Figure 8:
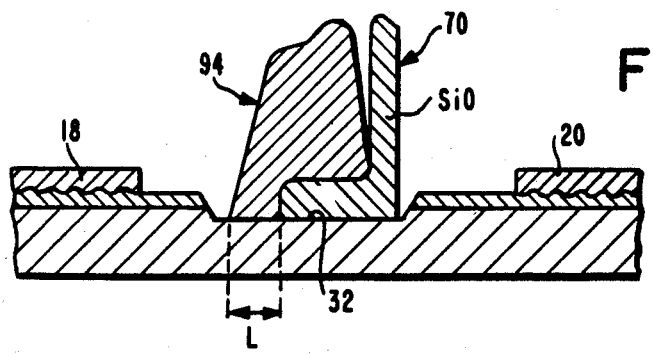
FIG. 8 is a diagrammatic cross-sectional illustration of an Γ-shaped gate, supported by a single gate wall.

A second embodiment of the present invention is directed to a process for fabricating a generally inverted-L-shaped gate electrode in the elongated resist cavity 30 formed in accordance with the photolithographic technique described with respect to FIG. 1. The process of this second embodiment is illustrated in FIGS. 6, 7 and 8, to which reference is now made.

After removal of the resist material from the gate pattern 26 in the manner described with reference to FIG. 1, the exposed, elongated surface 32 of the n-type semiconductor layer 10 may be etched in conventional manner to prepare that surface to receive the materials which are subsequently to be deposited. Thereafter, in accordance with the embodiment of FIG. 6, a single gate support wall 70 is formed by the angled deposition of a layer of gate support material. If the gate support wall 70 is to provide a permanent support for the gate electrode to be formed, then the wall 70 will be formed from an electrically insulating material such as a metal oxide. Silicon oxide (SiO) has been found to be a suitable material. If the support wall 70 is not to provide a permanent support for the gate electrode, but is to be removed in the manner discussed above, then a conductive material such as aluminum or the like may be used.

The support wall 70 is formed by the deposition, preferably by vapor deposition, of a suitable material at an angle $\theta$, as indicated by the arrows 70', the material being deposited at a single angle so that only one side of the resist cavity and a part of the semiconductor surface 32 are coated. By depositing the gate support wall material at an angle into the resist cavity 30, the edge 72 of the upper surface of the resist material 22 shadows the wall of the resist cavity 30 and that portion of the surface 32 which are not to be covered by the applied layer, thereby leaving a bottom opening 74 between the wall 70 and the uncovered wall of cavity 30 through which the surface 32 remains exposed. The thickness T of the resist layer 22, the angle $\theta$ of deposition of the support wall material, and the distance d across the opening of the resist cavity 30 cooperate to limit the resulting gate supporting wall 70 to a vertical leg portion 76 covering an interior wall 78 of the cavity 30 and a horizontal leg portion 80 covering about one half the length of the exposed semiconductor surface 32. Thus, the material to be deposited which passes by the edge 72 of the resist layer 22 strikes the surface 32 at point 82 to establish the extent to which the leg portion 80 extends along the length of the surface 32, and this point preferably is selected to be about halfway along that length.

The deposited support wall material defines a generally L-shaped wall 70 which, in turn, defines a generally inverted-L-shaped gate cavity 84 within the resist cavity 30. The deposited support wall material also forms a layer 86 on the upper surface of the resist 22 which tends to build up over the edge 72, as illustrated at 88 in FIG. 6, and thus affects the shape of the wall 70 and of the gate electrode to be deposited in gate cavity 84.

After formation of the gate cavity 84, a gate material indicated by arrows 90 (FIG. 7) is deposited into the cavity, as by conventional vapor deposition. The gate material 90 is supplied in a direction substantially perpendicular to the semiconductor surface 32 and is deposited on that surface and on the gate support wall 70. Since the resist layer 22 is slightly undercut, as illustrated 92, the edge 72, as well as the edge 88 of the layer 86, shadow a part of the semiconductor surface 32 which is exposed in the bottom opening 74, and limits the deposition of gate material 90 to a selected length L of the semiconductor surface 32. The gate material 90 accumulates on the semiconductor surface and on the surface of the gate support wall 70 to build a generally inverted-L-shaped (Γ-shaped) gate electrode 94.

It will be noted that the gate material, which preferably is a metal such as gold, also accumulates on the upper surface of the layer 86 to form another layer 96 which tends to further close the upper opening d of the cavity 30. This results in a gate electrode 94 which tapers inwardly in cross section as it builds up, as illustrated in FIGS. 7 and 8. The resulting gate electrode has a lower leg portion 98 which contacts the semiconductor surface 32 through the bottom opening 74 defined by support wall 70. The leg portion 94 has a length L which extends from the end 82 of the support wall 70 toward the uncovered wall of the resist cavity, and it is this portion which forms the Schottky interface. The gate also includes an enlarged upper portion 100 which extends over the lower leg portion 80 of the support wall 70.

Because the lower portion 80 of support wall 70 extends approximately halfway along the length of the portion of surface 32 exposed by the resist cavity 30, the leg portion 98 of the gate electrode is offset away from the side wall 78 of the resist cavity. When fabricating a MESFET device having a source and a drain formed on the semiconductor wafer 10 on opposite sides of the gate electrode 94, the leg portion 98 is offset toward the source 18, and the gate electrode 94 as a consequence is not symmetrical with respect to its leg portion 98. This lack of symmetry produces some mechanical instability, and requires that the gate support wall 70 remain as a permanent part of the electrode structure. However, a substantial advantage is obtained by this structure, since the offsetting of the leg portion 98 toward the source electrodes reduces the source gate spacing, indicated by the arrow 102, and reduces parasitic resistance, thereby permitting higher frequency operation of the MESFET device.

The deposition of the gate material and the formation of gate 94 is followed by the removal of the resist layer 22, which results in the simultaneous removal of the layers 86 and 96 which were deposited on the upper surface of resist 22. The removal of this material leaves the Γ-shaped gate 84 mounted on the semiconductor 32 and supported by the gate wall 70, as illustrated in FIG. 8. As previously indicated, in the preferred form of the invention the support wall is an insulating material such as SiO and remains as a permanent part of the electrode structure to support the gate electrode and to thereby provide stability and reliability to the structure.

Through the use of the present invention, gate electrodes with a length L as short as about 0.2 μm near the Schottky interface have been fabricated. In the embodiment of FIG. 3, the top portion 58 of the gate electrode 54 tapers from a length l, determined by the size of the gate cavity 48, to a length of l', which may be about 0.8 μm. Gates produced by this process had a thickness t (FIG. 3) of about 1.6 μm and a width W (FIG. 5) of about 150 μm. The measured gate resistance of devices fabricated in accordance with the invention was 6.1 Ω/mm of gate width. The electrical properties of the MESFET device of FIG. 5 were measured, and showed that at a frequency of 18 GHz the maximum available gain was 9 dB. A dual gate device constructed in accordance with the invention produced a maximum stable gain of 19.5 db at 18 GHz. However, these values were not optimized, since the GaAs material used in the experiment had a serious back-gating effect. Furthermore, it has been found that measured gate resistances can be further reduced by center feeding the T-shaped gate electrode.

Γ-shaped electrodes of the type illustrated in the embodiment of FIG. 8 exhibited similar low resistance properties, and can be fabricated to have a length on the order of 0.2 micrometers near the Schottky interface. Since the gate electrode is offset toward the source electrode in such a device, it has the advantage of a small parasitic source resistance and since it is permanently supported by a support wall, provides high stability and reliability. In addition, since only one angle of evaporation is needed to form the support wall, and thus to define the location of the Schottky interface, a better control of the gate length can be achieved while simplifying the overall process.

Thus, there has been described a simplified method of producing a highly useful low-noise, high-frequency MESFET device. Although the invention has been described in terms of preferred embodiments, it will be apparent from the true spirit and scope thereof, as set forth in the following claims.

What is claimed is:

1. A submicron metal line structure for a semiconductor gate electrode comprising:
    a semiconductor wafer having an upper surface;
    a source formed on said upper surface;
    a drain formed on said upper surface spaced from and generally parallel to said source;
    a gate electrode mounted on said upper surface between said source and said drain, said gate electrode having a leg portion engaging and forming a Schottky interface with said upper unitary surface and having an upper, enlarged portion, said enlarged portion being asymmetrical with respect to said leg portion to form a generally inverted-L-shaped cross-section, whereby said leg portion is offset toward said source; and
    a gate support wall mounted on said upper surface, said support wall having a generally L-shaped cross-sectional configuration corresponding to the cross-sectional shape of said gate electrode and engaging said gate electrode to mechanically support it on said upper surface.

2. The structure of claim 1, wherein said gate support wall is electrically insulating.

3. A submicron metal line structure for a semiconductor electrode comprising:
    a semiconductor wafer having an upper surface;
    an electrically insulating, unitary electrode support wall mounted on said upper surface, said electrode support wall being generally L-shaped in cross section and having a horizontal leg in contact with said upper surface and a vertical leg extending perpendicular to said upper surface, said horizontal and vertical legs defining an L-shaped electrode support wall surface; and
    a unitary metallic electrode formed on said support wall surface, said electrode being a generally inverted L-shape having a vertical electrode leg contacting said wafer upper surface and having a horizontal leg extending over and supported by said support wall vertical and horizontal legs, said electrode being asymmetrical with respect to said vertical electrode leg, and said support wall providing stability for said electrode.

4. The submicron metal line structure of claim 3, wherein said vertical electrode leg has a width on the order of 0.2 micrometers at its contact with said wafer upper surface.

5. The submicron metal line structure of claim 4, wherein said support wall and said electrode are mounted on said wafer upper surface between a source region and a drain region of said wafer, said electrode forming a low-resistance gate electrode.

6. The submicron metal line structure of claim 5, wherein said electrode vertical leg forms a Schottky interface at its contact with said wafer upper surface.

* * * * *